United States Patent
Nirschl et al.

(10) Patent No.: US 7,652,914 B2
(45) Date of Patent: Jan. 26, 2010

(54) MEMORY INCLUDING TWO ACCESS DEVICES PER PHASE CHANGE ELEMENT

(75) Inventors: Thomas Nirschl, Essex Junction, VT (US); Roger Cheek, Somers, NY (US); Mark Lamorey, South Burlington, VT (US); Ming-Hsiu Lee, Hsinchu (TW)

(73) Assignees: Qimonda North America Corp., Cary, NC (US); International Business Machines Corporation, Armonk, NY (US); Macronix International Co., Ltd., Hsin Chu (TW)

( * ) Notice: Subject to any disclaimer, the term of this patent is extended or adjusted under 35 U.S.C. 154(b) by 367 days.

(21) Appl. No.: 11/651,157

(22) Filed: Jan. 9, 2007

(65) Prior Publication Data

US 2008/0165573 A1 Jul. 10, 2008

(51) Int. Cl.
*G11C 11/00* (2006.01)

(52) U.S. Cl. .......................... 365/163; 365/46; 365/148

(58) Field of Classification Search .................. 365/46, 365/94, 100, 148, 163; 257/2–5, 296, E31.047, 257/E27.006; 438/29, 95, 96, 166, 365, 482, 438/486, 597
See application file for complete search history.

(56) References Cited

U.S. PATENT DOCUMENTS

| 6,522,594 | B1* | 2/2003 | Scheuerlein | 365/206 |
| 2003/0021148 | A1* | 1/2003 | Scheuerlein | 365/175 |
| 2003/0026120 | A1* | 2/2003 | Scheuerlein | 365/105 |
| 2004/0170053 | A1 | 9/2004 | Lee et al. | |
| 2005/0128785 | A1 | 6/2005 | Kang | |

* cited by examiner

*Primary Examiner*—Richard Elms
*Assistant Examiner*—Harry W Byrne
(74) *Attorney, Agent, or Firm*—Dicke, Billig & Czaja, PLLC (57) ABSTRACT

A memory includes a bit line and a phase change element. A first side of the phase change element is coupled to the bit line. The memory includes a first access device coupled to a second side of the phase change element and a second access device coupled to the second side of the phase change element. The memory includes a circuit for precharging the bit line and one of selecting only the first access device to program the phase change element to a first state and selecting both the first access device and the second access device to program the phase change element to a second state.

16 Claims, 4 Drawing Sheets

MEMORY INCLUDING TWO ACCESS DEVICES PER PHASE CHANGE ELEMENT

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

Embedded memory applications typically include a relatively small array of memory cells compared to stand alone memory applications. Due to the relatively small array of memory cells, for embedded memory applications optimization of read and write circuitry is typically sacrificed for simplicity.

For these and other reasons, there is a need for the present invention.

SUMMARY

One embodiment of the present invention provides a memory. The memory includes a bit line and a phase change element. A first side of the phase change element is coupled to the bit line. The memory includes a first access device coupled to a second side of the phase change element and a second access device coupled to the second side of the phase change element. The memory includes a circuit for precharging the bit line and one of selecting only the first access device to program the phase change element to a first state and selecting both the first access device and the second access device to program the phase change element to a second state.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
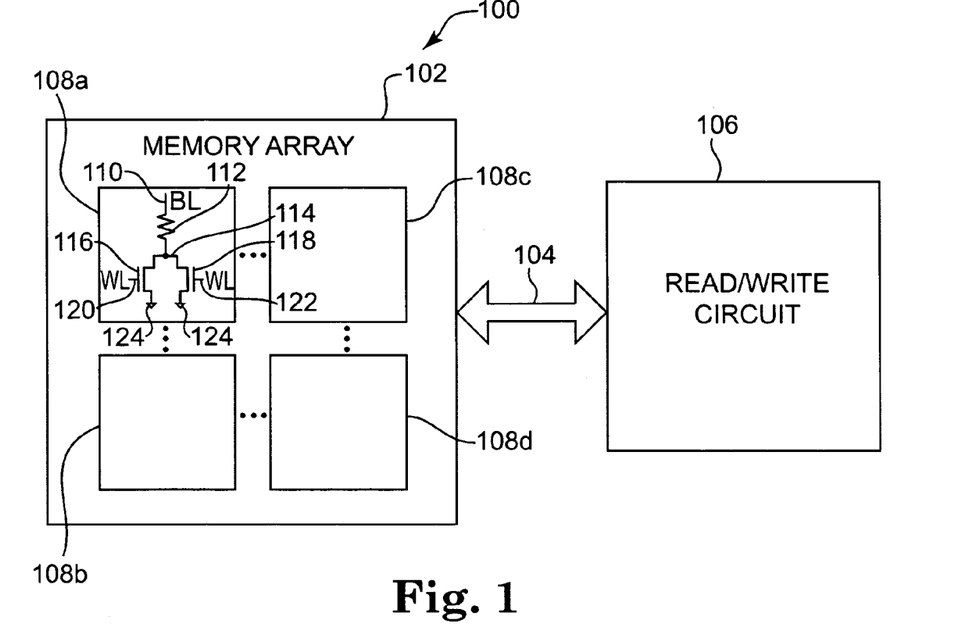
FIG. 1 is a block diagram illustrating one embodiment of a memory device.

FIG. 1 is a block diagram illustrating one embodiment of a memory device 100. In one embodiment, memory device 100 is an embedded memory device. Memory device 100 includes memory array 102 and a read/write circuit 106. Memory array 102 is electrically coupled to read/write circuit 106 through communication path 104. Memory array 102 includes phase change memory cells 108a-108d (collectively referred to as memory cells 108). A symmetrical write operation is used to program memory cells 108 to either a "1" state or a "0" state by using two access devices per memory cell. In addition, a similar pulse width is used for both read and write operations.

As used herein, the term "electrically coupled" is not meant to mean that the elements must be directly coupled together and intervening elements may be provided between the "electrically coupled" elements.

Each memory cell 108, as indicated for example in memory cell 108a, includes a phase change element 112, a first transistor 116, and a second transistor 118. While first transistor 116 and second transistor 118 are field-effect transistors (FETs) in the illustrated embodiment, in other embodiments, first transistor 116 and second transistor 118 can be other suitable devices such as bipolar transistors or 3D transistor structures. In other embodiments, diode-like structures may be used in place of first transistor 116 and second transistor 118.

One side of phase change element 112 is electrically coupled to a bit line (BL) 110. The other side of phase change element 112 is electrically coupled to one side of the source-drain path of first transistor 116 and one side of the source-drain path of second transistor 118 through signal path 114. The other side of the source-drain path of first transistor 116 is electrically coupled to a common or ground 124. The gate of first transistor 116 is electrically coupled to a first word line (WL) 120. The other side of the source-drain path of second transistor 116 is electrically coupled to common or ground 124. The gate of second transistor 118 is electrically coupled to a second word line 122.

Phase change element 112 comprises a phase change material that may be made up of a variety of materials in accordance with the present invention. Generally, chalcogenide alloys that contain one or more elements from group VI of the periodic table are useful as such materials. In one embodiment, the phase change material of phase change element 112 is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Read/write circuit 106 provides signals to memory array 102 through communication path 104 to read data from and write data to memory cells 108a-108d. To program memory cell 108a, read/write circuit 106 provides a precharge voltage on bit line 110 and provides voltage pulses on selected word lines 120 and 122 to form current pulses through phase change element 112. The current pulses program one of multiple resistance levels or states into phase change element 112. Read/write circuit 106 senses the state of each memory cell 108 and provides signals that indicate the state of the resistance of each memory cell. Read/write circuit 106 reads each of the states of memory cells 108.

In one embodiment, to read the resistance of one of the memory cells 108, such as memory cell 108a, read/write circuit 106 provides current that flows through phase change element 112 with one or both of first transistor 116 and second transistor 118 selected. Read/write circuit 106 then reads the voltage across phase change element 112. In another embodiment, read/write circuit 106 provides voltage across phase change element 112 and reads the current that flows through phase change element 112. The voltage and/or current levels used to read the resistance of a memory cell 108 are lower than the voltage and/or current levels used to program a memory cell to avoid changing the resistance of a memory cell during a read operation.

In one embodiment, first transistor 116 and second transistor 118 are matched. In this embodiment, during a set operation of phase change memory cell 108a, read/write circuit 106 precharges bit line 110 to a selected or fixed voltage. Next, read/write circuit 106 provides a voltage pulse on first word line 120 thereby forming a current pulse through phase change element 112 using first transistor 116. The current pulse heats phase change element 112 above its crystallization temperature (but usually below its melting temperature), as further described below with reference to FIG. 2. In this way, phase change element 112 reaches a crystalline state during this set operation.

In this embodiment, during a reset operation of phase change memory cell 108a, read/write circuit 106 precharges bit line 110 to the selected or fixed voltage. Next, read/write circuit 106 provides a voltage pulse on both first word line 120 and second word line 122 thereby forming a current pulse through phase change element 112 using both first transistor 116 and second transistor 118. The current pulse quickly heats phase change element 112 above its melting temperature. After the voltage pulse on first word line 120 and second word line 122 is turned off, phase change element 112 quickly quench cools into the amorphous state. Phase change memory cells 108b-108d and other phase change memory cells 108 in memory array 102 are programmed similarly to phase change memory cell 108a using a similar current pulse formed in response to the bit line and word line voltages.

In another embodiment, first transistor 116 and second transistor 118 are not matched. In this embodiment, during a set operation of phase change memory cell 108a, read/write circuit 106 precharges bit line 110 to a selected or fixed voltage. Next, read/write circuit 106 provides a voltage pulse on first word line 120 thereby forming a current pulse through phase change element 112 using first transistor 116. The current pulse heats phase change element 112 above its crystallization temperature (but usually below its melting temperature), as further described below with reference to FIG. 2. In this way, phase change element 112 reaches a crystalline state during this set operation.

In this embodiment, during a reset operation of phase change memory cell 108a, read/write circuit 106 precharges bit line 110 to the selected or fixed voltage. Next, read/write circuit 106 provides a voltage pulse on second word line 122 thereby forming a current pulse through phase change element 112 using second transistor 118. The current pulse quickly heats phase change element 112 above its melting temperature. After the voltage pulse on second word line 122 is turned off, phase change element 112 quickly quench cools into the amorphous state. Phase change memory cells 108b-108d and other phase change memory cells 108 in memory array 102 are programmed similarly to phase change memory cell 108a using a similar current pulse formed in response to the bit line and word line voltages.

Figure 2:
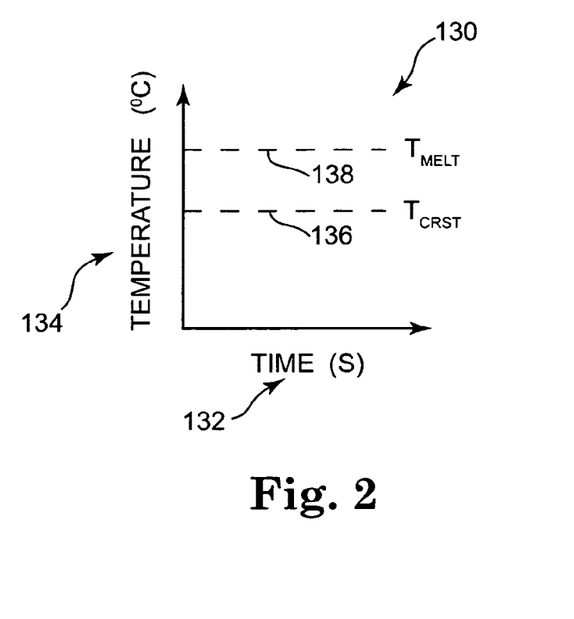
FIG. 2 is a chart illustrating one embodiment of phase change temperatures for a phase change material.

FIG. 2 is a chart 130 illustrating one embodiment of phase change temperatures for a phase change material. Chart 130 includes time in seconds (s) on x-axis 132 and temperature in degrees Celsius (° C.) on y-axis 134. The crystallization temperature of a phase change material is indicated at 136. The melting temperature of a phase change material is indicated at 138.

During a set operation of a memory cell 108 as described above, a first current pulse raises the temperature of phase change element 112 above the crystallization temperature 136 but less than the melting temperature 138. During a reset operation of a memory cell 108 as described above, a second current pulse raises the temperature of phase change element 112 above the melting temperature 138. The second current pulse provides a greater current through phase change element 112 than the first current pulse. Both the first current pulse and the second current pulse have the same pulse width. The first current pulse and the second current pulse and hence the temperature of phase change element 112 are controlled by selecting one or both of first transistor 116 and second transistor 118. The single pulse width and the single precharge voltage on bit line 110 used for both set and reset operations simplifies read/write circuit 106 for embedded applications. In another embodiment, the duration of the pulse width is changed to program a phase change element 112 to one of multiple resistance states.

Figure 3:
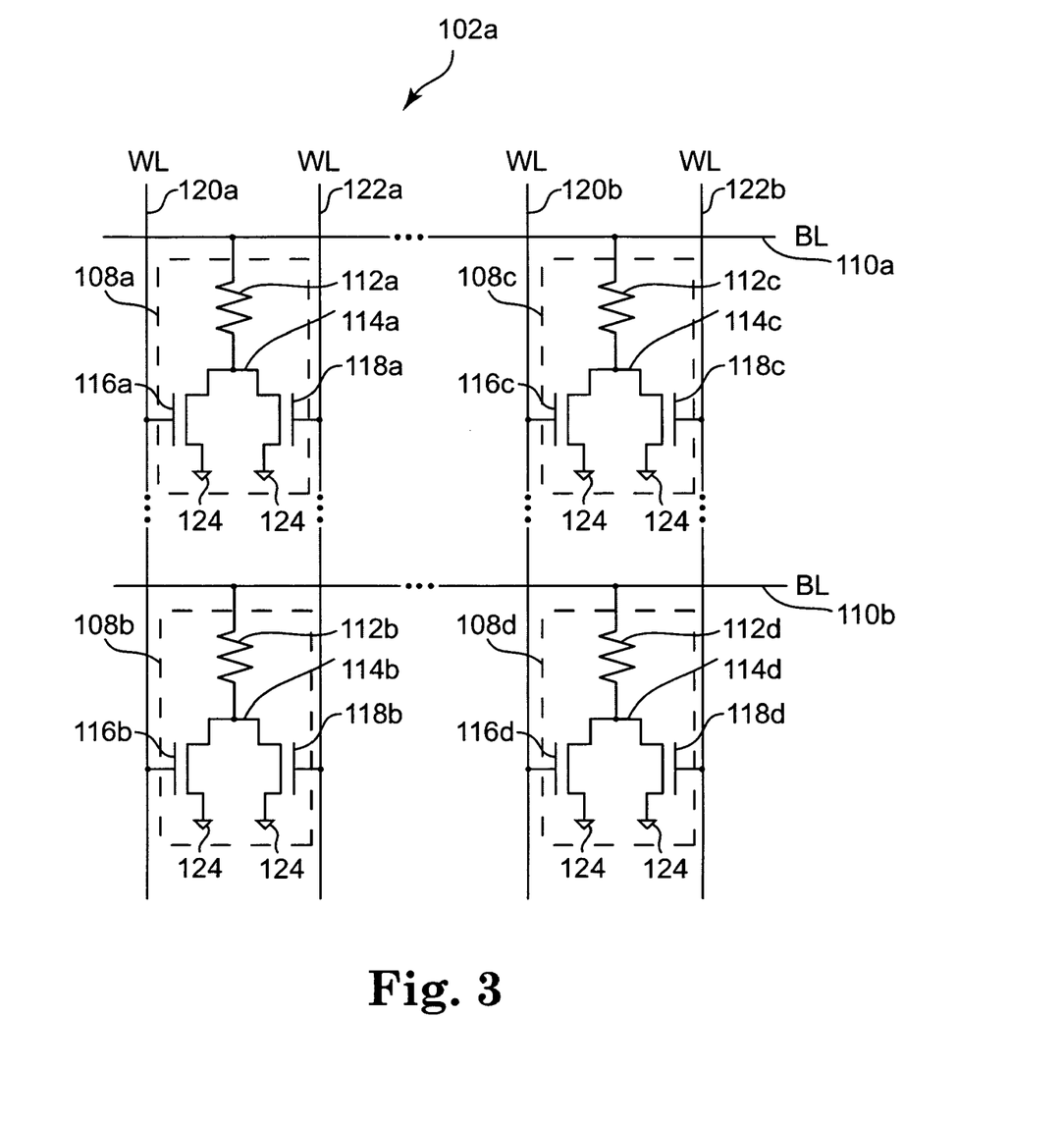
FIG. 3 is a schematic diagram illustrating one embodiment of an array of phase change memory cells.

FIG. 3 is a schematic diagram illustrating one embodiment of an array of phase change memory cells 102a. In one embodiment, memory array 102 is similar to array of phase change memory cells 102a. Each phase change memory cell 108 is electrically coupled to a first word line 120, a second word line 122, a bit line 110, and common or ground 124. Phase change memory cell 108a is electrically coupled to bit line 110a, first word line 120a, second word line 122a, and common or ground 124. Phase change memory cell 108b is electrically coupled to bit line 110b, first word line 120a, second word line 122a, and common or ground 124. Phase change memory cell 108c is electrically coupled to bit line 110a, first word line 120b, second word line 122b, and common or ground 124. Phase change memory cell 108d is electrically coupled to bit line 110b, first word line 120b, second word line 122b, and common or ground 124.

Each phase change memory cell 108 includes a phase change element 112, a first transistor 116, and a second transistor 118. Phase change memory cell 108a includes phase change element 112a, first transistor 116a, and second transistor 118a. One side of phase change element 112a is electrically coupled to bit line 110a. The other side of phase change element 112a is electrically coupled to one side of the source-drain path of first transistor 116a and one side of the source-drain path of second transistor 118a through signal path 114a. The other side of the source-drain path of first transistor 116a is electrically coupled to common or ground 124. The gate of first transistor 116a is electrically coupled to first word line 120a. The other side of the source-drain path of second transistor 118a is electrically coupled to common or ground 124. The gate of second transistor 118a is electrically coupled to second word line 122a.

Phase change memory cell 108b includes phase change element 112b, first transistor 116b, and second transistor 118b. One side of phase change element 112b is electrically coupled to bit line 110b. The other side of phase change element 112b is electrically coupled to one side of the source-drain path of first transistor 116b and one side of the source-drain path of second transistor 118b through signal path 114b. The other side of the source-drain path of first transistor 116b is electrically coupled to common or ground 124. The gate of first transistor 116b is electrically coupled to first word line 120a. The other side of the source-drain path of second transistor 118b is electrically coupled to common or ground 124. The gate of second transistor 118b is electrically coupled to second word line 122a.

Phase change memory cell 108c includes phase change element 112c, first transistor 116c, and second transistor 118c. One side of phase change element 112c is electrically coupled to bit line 110a. The other side of phase change element 112c is electrically coupled to one side of the source-drain path of first transistor 116c and one side of the source-drain path of second transistor 118c through signal path 114c. The other side of the source-drain path of first transistor 116c is electrically coupled to common or ground 124. The gate of first transistor 116c is electrically coupled to first word line 120b. The other side of the source-drain path of second transistor 118c is electrically coupled to common or ground 124. The gate of second transistor 118c is electrically coupled to second word line 122b.

Phase change memory cell 108d includes phase change element 112d, first transistor 116d, and second transistor 118d. One side of phase change element 112d is electrically coupled to bit line 110b. The other side of phase change element 112d is electrically coupled to one side of the source-drain path of first transistor 116d and one side of the source-drain path of second transistor 118d through signal path 114d. The other side of the source-drain path of first transistor 116d is electrically coupled to common or ground 124. The gate of first transistor 116d is electrically coupled to first word line 120b. The other side of the source-drain path of second transistor 118d is electrically coupled to common or ground 124. The gate of second transistor 118d is electrically coupled to second word line 122b.

In another embodiment, each phase change element 112 is electrically coupled to common or ground 124 and each first transistor 116 and each second transistor 118 is electrically coupled to a bit line 110. For example, for phase change memory cell 108a, one side of phase change element 112a is electrically coupled to common or ground 124. The other side of phase change element 112a is electrically coupled to one side of the source-drain path of first transistor 116a and one side of the source-drain path of second transistor 118a. The other side of the source-drain path of first transistor 116a is electrically coupled to bit line 110a. The other side of the source-drain path of second transistor 118a is electrically coupled to bit line 110a.

In one embodiment, bit lines 110 are substantially perpendicular to first word lines 120 and second word lines 122. In other embodiments, first word lines 120, second word lines 122, and bit lines 110 are oriented with respect to each other in other suitable arrangements. Read/write circuit 106 reads and programs phase change memory cells 108a-108d as previously described and illustrated with reference to FIG. 1.

Figure 4:
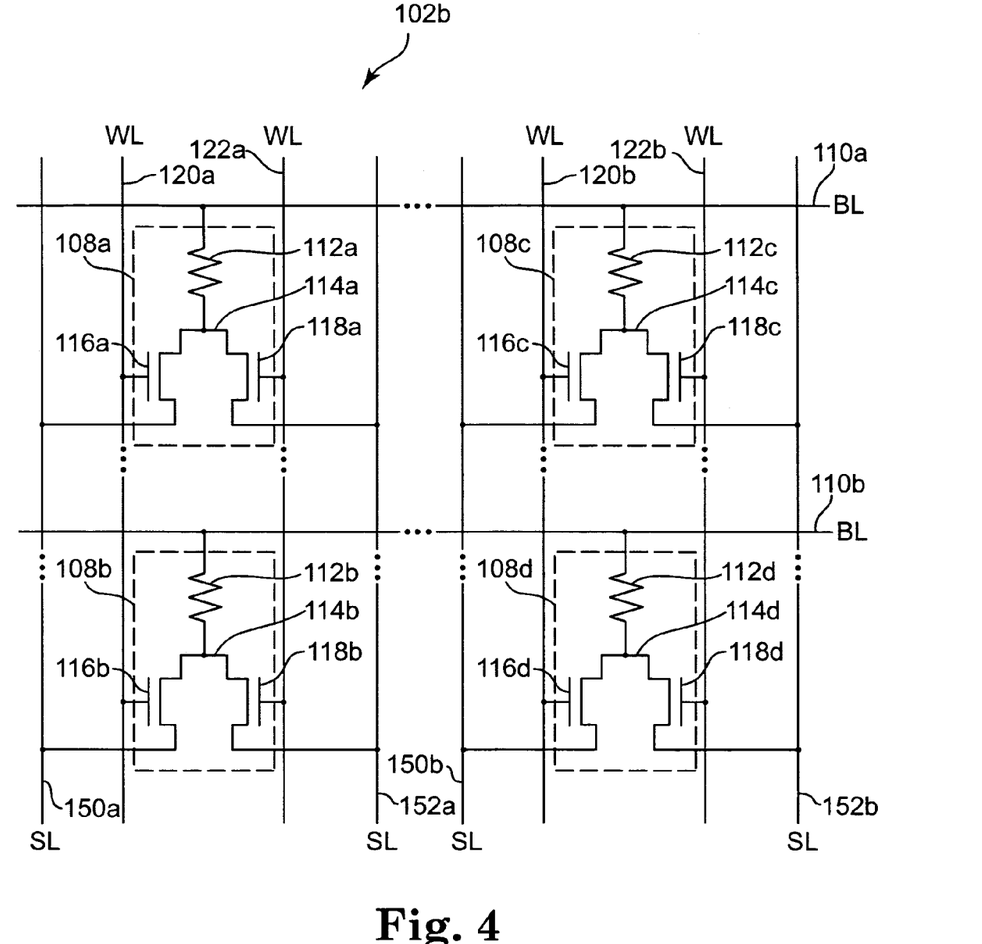
FIG. 4 is a schematic diagram illustrating another embodiment of an array of phase change memory cells.

FIG. 4 is a schematic diagram illustrating another embodiment of an array of phase change memory cells 102b. In one embodiment, memory array 102 is similar to array of phase change memory cells 102b. Array of phase change memory cells 102b is similar to array of phase change memory cells 102a previously described and illustrated with reference to FIG. 3, except that array of phase change memory cells 102b includes first source lines (SLs) 150 and second source lines 152. Each memory cell 108 is electrically coupled to a first source line 150 and a second source line 152. Memory cell 108a is electrically coupled to first source line 150a and second source line 152a. Memory cell 108b is electrically coupled to first source line 150a and second source line 152a. Memory cell 108c is electrically coupled to first source line 150b and second source line 152b. Memory cell 108d is electrically coupled to first source line 150b and second source line 152b. First source lines 150 and second source lines 152 are controlled independently.

Memory cell 108a includes phase change element 112a, first transistor 116a, and second transistor 118a. One side of phase change element 112a is electrically coupled to one side of the source-drain path of first transistor 116a and one side of the source-drain path of second transistor 118a through signal path 114a. The other side of the source-drain path of first transistor 116a is electrically coupled to first source line 150a. The other side of the source-drain path of second transistor 118a is electrically coupled to second source line 152a.

Memory cell 108b includes phase change element 112b, first transistor 116b, and second transistor 118b. One side of phase change element 112b is electrically coupled to one side of the source-drain path of first transistor 116b and one side of the source-drain path of second transistor 118b through signal path 114b. The other side of the source-drain path of first transistor 116b is electrically coupled to first source line 150a. The other side of the source-drain path of second transistor 118b is electrically coupled to second source line 152a.

Memory cell 108*c* includes phase change element 112*c*, first transistor 116*c*, and second transistor 118*c*. One side of phase change element 112*c* is electrically coupled to one side of the source-drain path of first transistor 116*c* and one side of the source-drain path of second transistor 118*c* through signal path 114*c*. The other side of the source-drain path of first transistor 116*c* is electrically coupled to first source line 150*b*. The other side of the source-drain path of second transistor 118*c* is electrically coupled to second source line 152*b*.

Memory cell 108*d* includes phase change element 112*d*, first transistor 116*d*, and second transistor 118*d*. One side of phase change element 112*d* is electrically coupled to one side of the source-drain path of first transistor 116*d* and one side of the source-drain path of second transistor 118*d* through signal path 114*d*. The other side of the source-drain path of first transistor 116*d* is electrically coupled to first source line 150*b*. The other side of the source-drain path of second transistor 118*d* is electrically coupled to second source line 152*b*.

In one embodiment, first source lines 150 and second source lines 152 are substantially parallel to first word lines 120 and second word lines 122. In one embodiment, first word lines 120 and second word lines 122 are substantially perpendicular to bit lines 110. In other embodiments, first word lines 120, second word lines 122, first source lines 150, second source lines 152, and bit lines 110 are oriented with respect to each other in other suitable arrangements.

Read/write circuit 106 programs phase change elements 112 as previously described and illustrated with reference to FIG. 1 except that a voltage is applied to the first source line 150 and the second source line 152 of the selected memory cell 108. The voltage applied to the first source line 150 and the second source line 152 in combination with the precharge voltage applied to the bit line 110 control the programming current generated through the selected phase change element 112 in response to selecting one or both of the first transistor 116 and the second transistor 118 of the selected memory cell 108.

Figure 5:
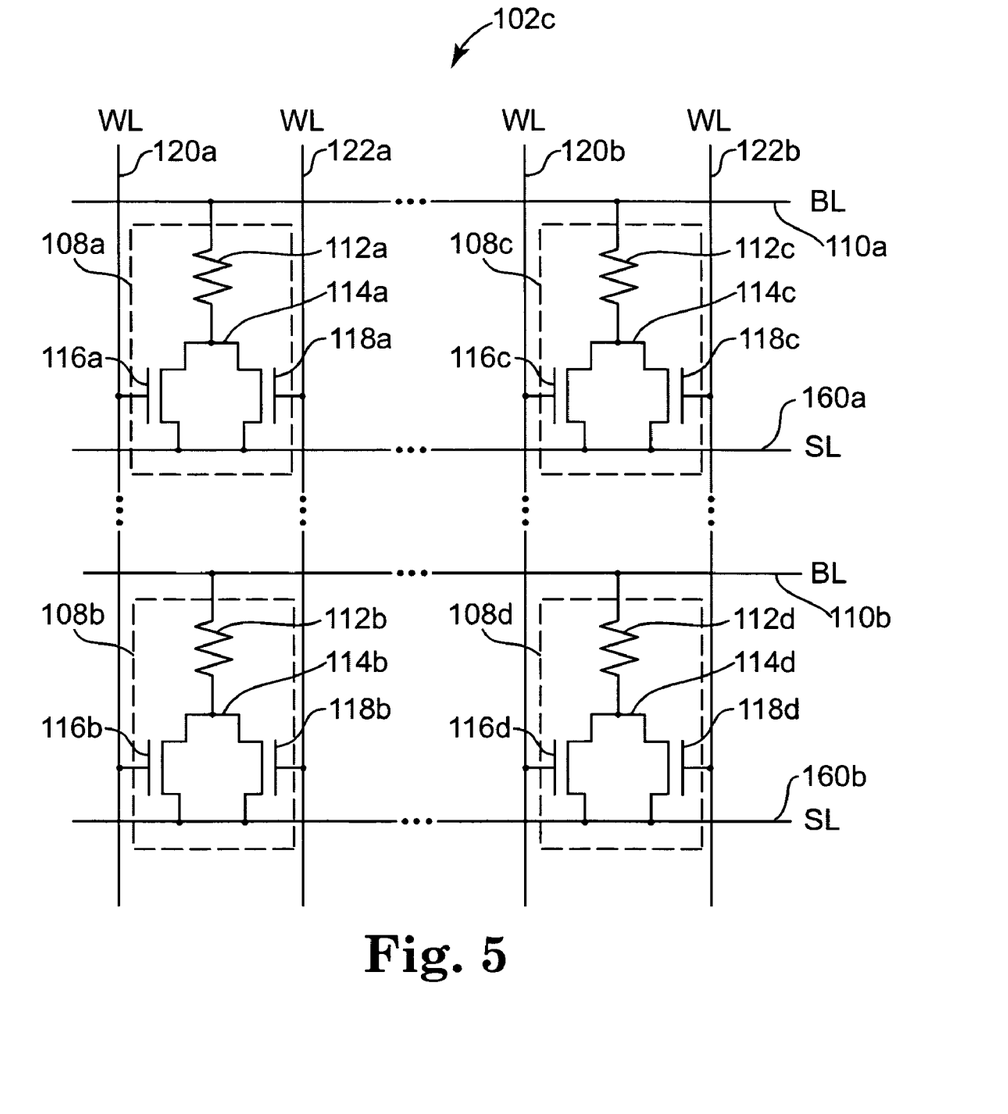
FIG. 5 is a schematic diagram illustrating another embodiment of an array of phase change memory cells.

FIG. 5 is a schematic diagram illustrating another embodiment of an array of phase change memory cells 102*c*. In one embodiment, memory array 102 is similar to array of phase change memory cells 102*c*. Array of phase change memory cells 102*c* is similar to array of phase change memory cells 102*a* previously described and illustrated with reference to FIG. 3, except that array of phase change memory cells 102*c* includes source lines 160. Each memory cell 108 is electrically coupled to a source line 160. Memory cell 108*a* is electrically coupled to source line 160*a*. Memory cell 108*b* is electrically coupled to source line 160*b*. Memory cell 108*c* is electrically coupled to source line 160*a*. Memory cell 108*d* is electrically coupled to source line 160*b*.

Memory cell 108*a* includes phase change element 112*a*, first transistor 116*a*, and second transistor 118*a*. One side of phase change element 112*a* is electrically coupled to one side of the source-drain path of first transistor 116*a* and one side of the source-drain path of second transistor 118*a* through signal path 114*a*. The other side of the source-drain path of first transistor 116*a* and the other side of the source-drain path of second transistor 118*a* are electrically coupled to source line 160*a*.

Memory cell 108*b* includes phase change element 112*b*, first transistor 116*b*, and second transistor 118*b*. One side of phase change element 112*b* is electrically coupled to one side of the source-drain path of first transistor 116*b* and one side of the source-drain path of second transistor 118*b* through signal path 114*b*. The other side of the source-drain path of first transistor 116*b* and the other side of the source-drain path of second transistor 118*b* are electrically coupled to source line 160*b*.

Memory cell 108*c* includes phase change element 112*c*, first transistor 116*c*, and second transistor 118*c*. One side of phase change element 112*c* is electrically coupled to one side of the source-drain path of first transistor 116*c* and one side of the source-drain path of second transistor 118*c* through signal path 114*c*. The other side of the source-drain path of first transistor 116*c* and the other side of the source-drain path of second transistor 118*c* are electrically coupled to source line 160*a*.

Memory cell 108*d* includes phase change element 112*d*, first transistor 116*d*, and second transistor 118*d*. One side of phase change element 112*d* is electrically coupled to one side of the source-drain path of first transistor 116*d* and one side of the source-drain path of second transistor 118*d* through signal path 114*d*. The other side of the source-drain path of first transistor 116*d* and the other side of the source-drain path of second transistor 118*d* are electrically coupled to source line 160*b*.

In another embodiment, each phase change element 112 is electrically coupled to a source line 160 and each first transistor 116 and each second transistor 118 is electrically coupled to a bit line 110. For example, for phase change memory cell 108*a*, one side of phase change element 112*a* is electrically coupled to source line 160*a*. The other side of phase change element 112*a* is electrically coupled to one side of the source-drain path of first transistor 116*a* and one side of the source-drain path of second transistor 118*a*. The other side of the source-drain path of first transistor 116*a* and the other side of the source-drain path of second transistor 118*a* are electrically coupled to bit line 110*a*.

In one embodiment, source lines 160 are substantially parallel to bit lines 110. In one embodiment, bit lines 110 are substantially perpendicular to first word lines 120 and second word lines 122. In other embodiments, first word lines 120, second word lines 122, source lines 160, and bit lines 110 are oriented with respect to each other in other suitable arrangements.

Read/write circuit 106 programs phase change elements 112 as previously described and illustrated with reference to FIG. 1 except that a voltage is applied to the source line 160 of the selected memory cell 108. The voltage applied to the source line 160 in combination with the precharge voltage applied to the bit line 110 control the programming current generated through the selected phase change element 112 in response to selecting one or both of the first transistor 116 and the second transistor 118 of the selected memory cell 108.

Embodiments of the present invention provide phase change memory cells that are programmed to both the set (crystalline) and reset (amorphous) states using a single pulse width. In addition, a single precharge voltage is applied to the bit line of the selected memory cell for both set and reset operations. One or two access devices are selectively activated to control the current through a selected phase change memory cell to set or reset the memory cell. The array of phase change memory cells and the read/write circuit for programming the phase change memory cells are simplified compared to stand alone memories, therefore they are suitable for an embedded memory application.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   a bit line;
   a phase change element, a first side of the phase change element coupled to the bit line;
   a first access device coupled to a second side of the phase change element;
   a second access device coupled to the second side of the phase change element; and
   a circuit for precharging the bit line and one of selecting only the first access device to program the phase change element to a first state and selecting both the first access device and the second access device to program the phase change element to a second state.

2. The memory of claim 1, wherein the first access device comprises a first transistor and the second access device comprises a second transistor.

3. The memory of claim 2, wherein the first transistor is matched to the second transistor.

4. The memory of claim 2, further comprising:
   a first word line coupled to a gate of the first transistor; and
   a second word line coupled to a gate of the second transistor.

5. The memory of claim 4, wherein the circuit selects the first transistor by applying a first pulse having a first duration to the first word line and selects the second transistor by applying a second pulse having a second duration to the second word line, wherein the circuit programs the phase change element to one of multiple states based on the first duration and the second duration.

6. The memory of claim 1, wherein the first state comprises a set state and the second state comprises a reset state.

7. The memory of claim 1, wherein the memory comprises an embedded memory.

8. A memory comprising:
   a bit line;
   a phase change element, a first side of the phase change element coupled to the bit line;
   a first access device coupled to a second side of the phase change element;
   a second access device coupled to the second side of the phase change element; and
   a circuit for precharging the bit line and one of selecting the first access device to program the phase change element to a first state and selecting the second access device to program the phase change element to a second state.

9. The memory of claim 8, wherein the first access device comprises a first transistor and the second access device comprises a second transistor.

10. The memory of claim 9, further comprising:
    a first word line coupled to a gate of the first transistor; and
    a second word line coupled to a gate of the second transistor.

11. The memory of claim 10, wherein the circuit selects the first transistor by applying a first pulse having a first duration to the first word line and selects the second transistor by applying a second pulse having a second duration to the second word line, wherein the circuit programs the phase change element to one of multiple states based on the first duration and the second duration.

12. The memory of claim 8, wherein the first state comprises a set state and the second state comprises a reset state.

13. The memory of claim 8, wherein the memory comprises an embedded memory.

14. A memory comprising:
    a bit line;
    a phase change element, a first side of the phase change element coupled to the bit line;
    first means coupled to a second side of the phase change element for accessing the phase change element;
    second means coupled to the second side of the phase change element for accessing the phase change element; and
    means for precharging the bit line to a first voltage and one of selectively activating one of the first means and the second means individually and activating the first means and the second means simultaneously to program the phase change element to one of a first state and a second state.

15. The memory of claim 14, wherein the first state comprises a crystalline state and the second state comprises an amorphous state.

16. The memory of claim 14, wherein the memory comprises an embedded memory.

* * * * *

UNITED STATES PATENT AND TRADEMARK OFFICE
CERTIFICATE OF CORRECTION

PATENT NO. : 7,652,914 B2
APPLICATION NO. : 11/651157
DATED : January 26, 2010
INVENTOR(S) : Nirschl et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 384 days.

Signed and Sealed this

Twenty-third Day of November, 2010

David J. Kappos
*Director of the United States Patent and Trademark Office*